United States Patent [19]

Mikos

[11] Patent Number: 5,081,603
[45] Date of Patent: Jan. 14, 1992

[54] AMPLITUDE-CONTROL SYSTEM FOR A SIGNAL GENERATOR

[75] Inventor: Jerome J. Mikos, Sylmar, Calif.

[73] Assignee: Easton Corporation, Cleveland, Ohio

[21] Appl. No.: 502,707

[22] Filed: Apr. 2, 1990

[51] Int. Cl.⁵ .............................................. G06F 1/02
[52] U.S. Cl. ................................................ 364/718
[58] Field of Search .................... 364/718-721, 364/571.01, 571.06, 571.07; 307/493; 328/31

[56] References Cited

U.S. PATENT DOCUMENTS

| | | | |
|---|---|---|---|
| 3,727,037 | 4/1973 | Zorn | 235/150 |
| 3,735,269 | 5/1973 | Jackson | 328/14 |
| 3,813,528 | 5/1974 | Blanding | 235/152 |
| 4,039,806 | 8/1977 | Fredriksson et al. | 235/152 |
| 4,410,955 | 10/1983 | Burke et al. | 364/718 |
| 4,484,296 | 11/1984 | Treise et al. | 364/607 |
| 4,626,787 | 12/1986 | Mefford | 328/14 |
| 4,680,726 | 7/1987 | Malka et al. | 364/721 |
| 4,683,795 | 8/1987 | Kitamura et al. | 364/718 |
| 4,752,901 | 6/1988 | Goldberg | 364/721 |
| 4,757,465 | 7/1988 | Hakoopean et al. | 364/718 |
| 4,791,384 | 12/1988 | Mackey et al. | 364/718 |

OTHER PUBLICATIONS

Tierney et al., "A Digital Frequency Synthesizer", IEEE Trans. on Audio and Electroacoustics, vol. AU-19, #1, pp. 48-56, 3/1971.

*Primary Examiner*—Dale M. Shaw
*Attorney, Agent, or Firm*—C. H. Grace; M. L. Union

[57] ABSTRACT

An amplitude-control system for a signal generator corrects for variations that occur in the amplitude of output signal upon changing of the specified frequency. It also corrects for errors that occur (due to non-linearity) in the amplitude of its output signal upon changing of the specified amplitude. The amplitude-control system performs both of the amplitude corrections simultaneously and very rapidly by means of an arrangement that employs mostly hardware and very little software. Look-up tables that are stored in memories are read directly instead of by a CPU, and a resulting control signal sets the gain of an amplifier that has voltage-controllable gain. The amplifier amplifies the uncorrected output of the signal generator so as to provide an output signal of corrected amplitude. Calibration is accomplished by automatically or semi-automatically by loading correction data into the memories to form look-up tables.

7 Claims, 1 Drawing Sheet

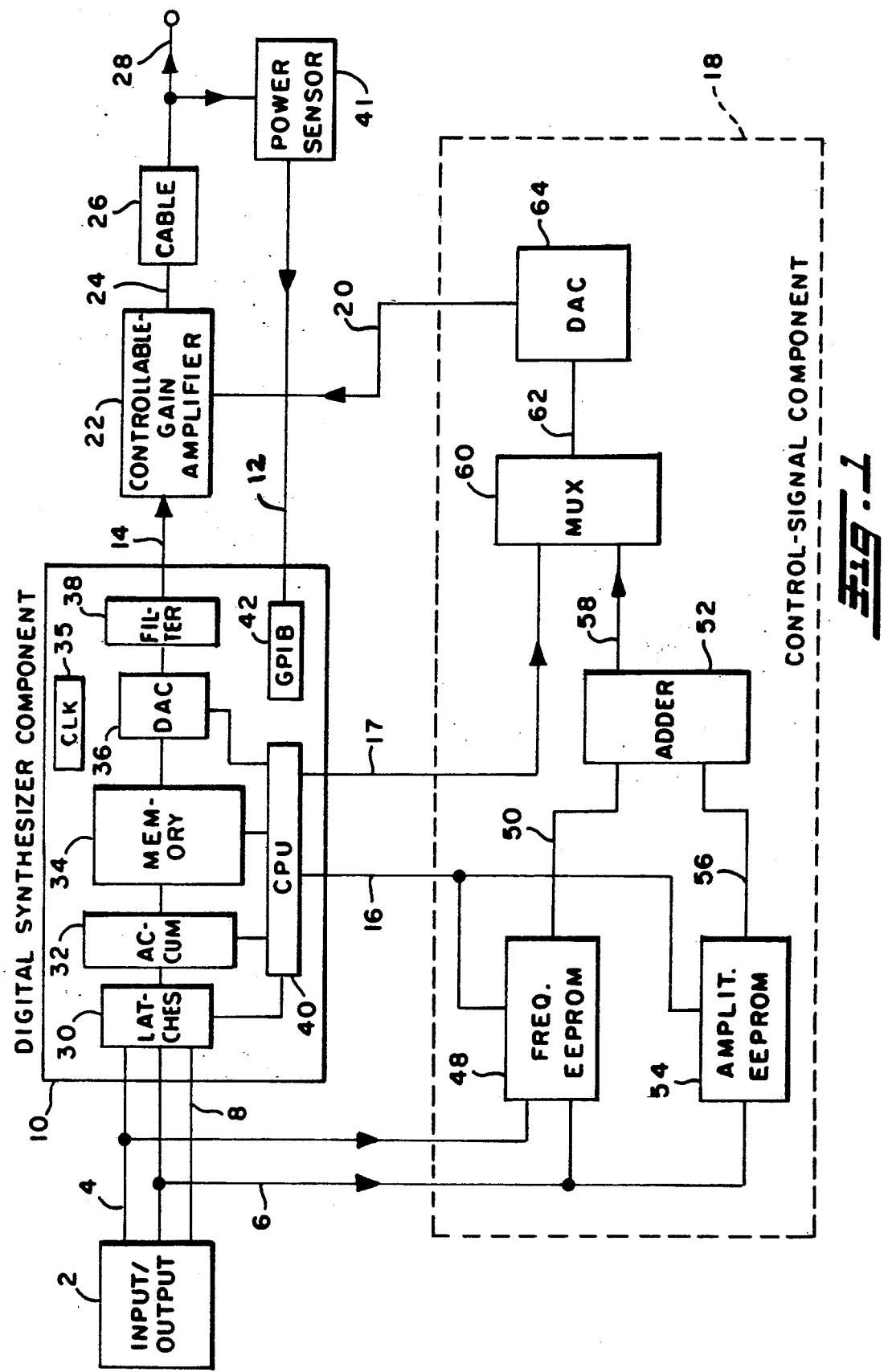

AMPLITUDE-CONTROL SYSTEM FOR A SIGNAL GENERATOR

FIELD OF THE INVENTION

The invention relates to electronic signal generation and to signal generators of selectable frequency and amplitude.

BACKGROUND

The amplitude of the output of a signal generator may vary when the specified frequency is changed, and the output may change non-linearly when the specified amplitude is changed; these are undesirable effects. If the amplitude of such a signal generator is to be maintained constant, corrections must be made for both effects.

The frequency effect is a variation of output amplitude as a function of frequency, which is often a result of voltage-standing-wave ratios (VSWR), etc. The amplitude effect is a variation of achieved output amplitude as a function of specified amplitude, which is due to non-linearity of the relationship between specified amplitude and achieved output amplitude over the available amplitude range.

One prior method of making the necessary corrections involves the use of software or firmware. When a user specifies a given output amplitude and frequency, a control component (such as a microprocessor) of the prior system makes the necessary corrections under the control of a clock-paced program in a central processing unit (CPU). The CPU first looks up the amplitude correction in a correction table, based on the specified frequency value (and upon the specified amplitude value). This yields the amplitude-vs-frequency correction, which is a signed value. Then a second value is read by the microprocessor from a second calibration table, based upon the specified amplitude. This value is added by the microprocessor to the first and is used to correct the output amplitude.

An important limitation of the prior method is that it takes a long time for the microprocessor of the signal generator to perform the amplitude corrections. This limits the use of the amplitude-correction feature to the fixed-frequency mode of operation of the signal generator, i.e., it prevents the use of the correction feature during a swept-frequency mode of operation. Moreover, even in the fixed-frequency mode the correction does not settle to steady state until after the frequency has stabilized, a fact that limits the switching speed of the signal generator of the prior system.

SUMMARY OF THE INVENTION

The invented apparatus described here permits the amplitude corrections to be performed in real time and even permits correction during frequency sweeping at high speed. Also, in a fixed-frequency mode of operation, in which frequency is switched in a step fashion, the correction is accomplished before the frequency has stabilized, so switching speed is not limited by a correction delay.

The invented apparatus involves hardware-based circuitry for the correction lookup tables and an adder. During calibration the amplitude-vs-amplitude values are written into an EEPROM (the amplitude-effect-correction EEPROM) and the amplitude-vs-frequency values are written into a second EEPROM (the frequency-effect-correction EEPROM).

When a user specifies an amplitude, the specified value is latched into a register and employed as an address for reading the amplitude-effect-correction EEPROM.

Simultaneously the user-specified frequency value is applied to the frequency-effect-correction EEPROM.

The output values read from the EEPROMs then are added together in a binary adder to form a combination control level, which is converted in a DAC to provide an analog control voltage. That is applied to a control terminal of a controllable-gain amplifier for controlling the output signal amplitude. Thus the invented apparatus employs hardware to control and correct the amplitude of its output waveform in real time.

The use of hardware enables much faster operation. The invention's real-time correction system requires much less time than prior CPU-performed software/firmware amplitude correctors. For example, one embodiment of the invention requires 100 nanoseconds to read its EEPROMs, 20 nanoseconds for an addition of the two correction factors, and 100 nanoseconds for digital-to-analog conversion, for a total correction time of about 220 nanoseconds. The invented amplitude correction apparatus is therefore so fast that correction can be performed during frequency sweeping at, e.g., a 1 Mz sweep-repetition rate of a microwave signal generator.

On the other hand, the prior software/firmware method requires the steps of: move data into a register, look into a table, add, write, and latch. Execution of all of these instructions under software contol requires dozens of clock cycles. Assuming a 100-nanosecond computer clock period, that method takes at least ten times as long.

Accordingly, one object of the invention is to provide an amplitude-control system for a signal generator having rapid real-time correction of the amplitude of the output signal.

Another object is to provide an amplitude-control system for a signal generator that corrects the output amplitude so that it is unresponsive to changes in the specified frequency and the specified amplitude, and to make the corrections so quickly that the signal generator can be operated in a fast-switching mode or in a swept-frequency mode.

Another object is to provide an amplitude-correction system for a signal generator in which correction table look-ups are performed simultaneously in two memories, and by direct hardware look-up.

Another object is to provide an amplitude-control system in which two correction signals are added in a real-time logic gate adder, rather than a slow clock-stepped register-type arithmetic adder.

Another object is to provide an amplitude-control system in which a hardware-produced correction is made in the main analog output signal by means of a controllable-gain amplifier.

Another object is to provide an amplitude-control system for a signal generator which is amenable to easy and accurate calibration.

Other objects are apparent from the description and claims that follow.

BRIEF DESCRIPTION OF THE FIGURE

FIG. 1, the sole FIGURE, is a block diagram of a signal generator system incorporating a preferred embodiment of the invented amplitude-control system.

DESCRIPTION

Configuration of the Overall System

Described herein is the preferred embodiment of an amplitude-control arrangement for a signal generator system, which is shown in FIG. 1. This example utilizes a type of signal generator known as a direct digital synthesizer, although the invention works equal well with other types of signal generators. The system includes an input/output (I/O) device 2, one purpose of which is to receive manual (or automatic) input commands that specify the desired output waveform of the synthesizer system as a whole. The I/O device 2 includes a keyboard.

Outputs 4, 6, 8 from the I/O device 2 provide a digital representation of the desired output frequency, a digital representation of the desired output amplitude, and also, if a swept-frequency output waveform is desired from the synthesizer, data for specifying sweep parameters. A typical sweep-frequency rate is 1 MHz in the microwave signal generator system being described.

In the preferred embodiment being described, the outputs 4, 6, 8, of I/O device 2 are input to a direct digital synthesizer 10, which is described in more detail in a separate section below. Briefly, however, the function of synthesizer 10 is to produce an analog output signal having a precise frequency specified by the user and an uncorrected amplitude level. The frequency varies with time when the apparatus is operated in a swept-frequency mode.

Another input into the digital synthesizer 10 is a line 12, which brings feedback representing the final output signal to the synthesizer 10 for purposes of calibrating a control-signal component 18.

A main output of the synthesizer 10 is an analog signal at a terminal 14. It has the frequency that was requested by the operator, but its amplitude has not yet been corrected to the requested amplitude. Other output connections from synthesizer 10 are lines 16 and 17, which connect to the control-signal component 18. Line 16 sometimes has commands and calibration data. Line 17 sometimes has switching commands and a surrogate control signal produced by the synthesizer 10 for use in the calibration procedure, and as explained in a separate section below.

Outputs 4 and 6 of the I/O device 2 are also connected to input terminals of the control-signal component 18. The purpose of block 18 is to produce an analog control signal at its output 20. The signal on line 4, which is input to block 18, is a digital specification of the desired frequency of the output signal from the entire apparatus. Input 6 to the control-signal component 18 is a digital specification of the desired amplitude of the final output signal from the complete apparatus.

Block 22 is a controllable-gain amplifier. At its input terminal from line 14 it receives an analog signal having the desired final output frequency. It receives an amplitude-control signal at another of its inputs, from line 20. The purpose of the controllable-gain amplifier 22 is to change the amplitude of the input signal which it receives at terminal 14 in accordance with the amplitude-control signal at terminal 20, and provide a corrected output RF signal at its terminal 24.

The output signal at 24 is of the same frequency as the input signal at terminal 14, but in general is of a different amplitude, as determined by the control signal on terminal 20. Block 22 is a conventional gain-controllable amplifier; many types are well known in the prior art.

The output at terminal 24 of block 22 may, if desired, be input to a cable represented by a block 26 or to some other device. The output of block 26 is the final output terminal 28 of the entire signal generator system.

Operation of the Overall System

An operator enters a desired frequency, amplitude, and sweep waveform characteristics if desired, at the keyboard of the I/O device 2. Modules for inputting the choices of frequency and amplitude are well known in the art; they translate the input appropriately for use by a CPU. This digital information is conducted to the direct digital synthesizer 10 via the lines 4, 6, 8, where a central processing unit (CPU) 40 in the direct digital synthesizer sets up latches to retain the keyboard data. The CPU 40 computes the size of phase step that corresponds to the desired frequency. The phase-step size is merely proportional the desired frequency.

A signal of the desired frequency at terminal 14 of the direct digital synthesizer 10 passes through the controllable-gain amplifier 22 and is reproduced at terminal 24 at the output of amplifier 22. The signal at terminal 24 has the same frequency but greater or smaller amplitude than the signal at terminal 14. The signal at terminal 24 then passes through the cable 26 or other output-related device to the final output terminal 28 of the entire apparatus.

The gain of the amplifier 22 is controlled by the control-signal component 18 via the control signal on line 20. The operation of the control-signal component 18 is described in much more detail below, following a brief description of the direct digital synthesizer component 10.

Details of the Digital Synthesizer Component

The synthesizer 10 in the preferred embodiment being described is a Model 380 Direct Digital Synthesizer, manufactured by Eaton Corporation's Electronic Instrumentation Division, Los Angeles, Calif. A brief description of it is necessary here in order to explain the overall system.

The direct digital synthesizer 10 includes input latches 30, an accumulator 32, a memory 34, a DAC 36, a bandpass filter 38, the CPU 40 that controls the operation of the entire system, and a general-purpose interface bus (GPIB) 42 used during calibration etc. The synthesizer 10 receives digital information specifying a desired frequency and amplitude and produces at its output a cyclical signal having the specified waveform.

Various instantaneous values, corresponding to voltages at successive phase angles of the desired output waveform, are stored digitally in advance at successive addresses in a memory 34. To generate an output signal a clock 35 establishes sampling times, at each of which a "phase accumulator" 32 generates a successive address with which to address the memory 34.

A stored digital sample value of the desired output waveform is read from each address. The clock frequency is constant, so the size of the address steps at which sample values of the stored waveform are read controls the frequency of the wave that is produced.

A sine wave can serve as an example. Many values of a sine function table can be stored in the memory 34 at successive addresses corresponding to successive phase angles. The storage memory 34 is accessed at a clock-determined sampling rate with a "staircase-shaped" addressing function from the accumulator 32. The values of a sign wave are read from the memory 34, in digital form, at 5-degree steps (for example) along the sine function table.

The successive digital values which are read out of memory 34 are converted to analog voltages by a digital-to-analog converter (DAC) 36, to produce a stepped waveform similar to a sine wave. The stepped waveform is smoothed by filtering in a bandpass filter 38 to produce a relatively smooth sine wave at the output 14. Of course other waveforms can be produced if desired by storing their shapes in the memory 34.

Continuing the sine wave example being described, if it is desired to produce an output at twice the previous frequency, sample values are taken with the same clock-determined sampling rate as above, but at 10-degree steps instead of 5-degree steps along the stored waveform. Some memory addresses that were read before are now skipped, so a relatively time-compressed waveform is produced, and the output signal has a higher frequency.

To summarize the synthesizer operation described above, the size of the desired phase step to be produced upon each clock-determined interval is set in the latches 30. Each incremental phase step of a selected size is added in the accumulator 32, and the accumulated contents of accumulator 32 are used to address the memory 34. The memory 34 contains a stored waveform, such as for example, the sine wave discussed above.

Each address of the memory 34 represents a phase angle of a sine wave, (in the example), and the contents of each such memory address represent the instantaneous value (e.g. voltage) of the wave at that phase. The output from the memory 34, as read in successive steps, is applied to the input of the digital-to-analog converter 36.

The output of the DAC 36 is an analog waveform, accompanied by unwanted higher-frequency noise of the steps. The unwanted higher-frequency noise is greatly attenuated by the bandpass smoothing filter 38, yielding a relatively pure waveform of the desired frequency at the output terminal 14.

The CPU 40 that is a part of the synthesizer 10 is a Model 8086 manufactured by Intel Corp. Its functions are described in other sections hereof and in some prior art publications. The CPU 40 is programmed to perform these functions by ordinary programming techniques that are well known in the computer art. The subject is treated generally in an article entitled "A Digital Frequency Synthesizer" published in IEEE Transactions On Audio and Electroacoustics, Volume AU-19, No. 1, March 1971, pages 48–56, and authored by Tierney, et al, which is incorporated herein by reference.

Parts of the Control-Signal Component

The control-signal component 18 is shown on the lower half of FIG. 1. The same type of control lines from the I/O device 2 that control the digital synthesizer 10 are routed also to the control-signal component 18. The control-signal component 18 includes an electrically erasable programmable read-only memory (EEPROM) 48, which stores amplitude-correction data related to frequency-caused variations in the amplitude of the synthesized waveform. Block 48 is an Intel Corporation Model 28F512 memory device.

EEPROM 48 is loaded with a look-up table that is entered with the desired frequency and amplitude, and that puts out a digital level at a line 50 that controls one term of the gain-control signal at the terminal 28. The line 50, which connects to one input of an adder 52, represents 8 bits of digital data. The adder 52 is preferably a real-time logic gate type of adder, not a arithmetic step-by-step clock-controlled adder.

One part of a two-part address that is input to the EEPROM 48 is on line 4 (8 bits), stating the desired frequency. Another part of the two-part address that is input to EEPROM 48 is on line 6 (8 bits), which provides desired-amplitude data. The data from lines 4 and 6 are combined to form a single address for the EEPROM 48. The amplitude information is necessary in order to scale the frequency corrections provided by EEPROM 48 to the output amplitude, because a greater output amplitude requires a proportionately greater frequency-sensitive correction of amplitude. The frequency-sensitive EEPROM 48 is large enough to store a two-dimensional table that is entered by the combined frequency and amplitude data.

Another input to block 48 is the line 16; it conducts commands and data to and from the CPU 40 of the synthesizer 10. The commands include read and write commands that are used during calibration and operation. The data includes correction data, (which contributes to gain-control signals) that are stored in the EEPROM 48 during calibration and that are read out during routine operation.

Another EEPROM 54 receives data at its input terminal from line 6 (8 bits) specifying the desired amplitude of the final output signal of the entire synthesizer. Block 54 is also an Intel Model 28F512 memory device. Another of the inputs to EEPROM 54 is the line 16, which conveys commands and data between the CPU 40 and the EEPROM 54, as is done in the case of EEPROM 48.

EEPROM 54 stores control data that correct the final output amplitude to compensate for variations in that amplitude that are present at terminal 14 due to amplitude-sensitivity of the synthesizer 10 etc. That is, it corrects for non-linearity of the relationship between amplitude commands and amplitude response. An output line 56 from EEPROM 54 (8 bits) is input to the adder 52, to provide an output-amplitude-correction term based upon commanded amplitude.

The adder 52 receives two inputs, namely lines 50 and 56. Adder 52, which is a Texas Instruments Model 74LS181 semiconductor device, adds the data that it receives from the memories 48 and 54, and provides an output signal on a line 58.

The 8-bit line 58 is connected as one input to a multiplexer 60, which is a conventional Texas Instruments Model 74LS157 multiplexer. Another input to the multiplexer 60 is a line 17 from the CPU 40. Line 17 has switching commands and data. Multiplexer 60, which serves as a "double-throw selector switch" under the control of CPU 40, selects either the data of line 58 or the data of line 17 and conveys it to the multiplexer's output line 62.

A digital-to-analog converter (DAC) 64 receives digital information on the 8-bit line 62 representing a desired amplitude-control signal. The DAC 64 is a Model 7845, made commercially by Analog Devices, of 1 Technology Way, Norwood, Mass. It converts the digital data to an analog level signal at its output line 20, which is the control line that controls the gain of the controllable-gain amplifier 22.

Operation of the Control-Signal Component

From the I/O device 2 the control-signal component 18 receives a frequency-specifying signal at line 4 and receives an amplitude-specifying signal at line 6. The frequency-specifying signal is employed in the EEPROM 48 to address a storage location, whose data contents are read out via line 50 and conducted to a first input of the adder 52. The data contents can be positive or negative (or zero). One of the many factors for which the data of EEPROM 48 makes corrections is the shape of the bandpass curve (amplitude vs frequency) of the bandpass filter 38, which affects the amplitude at line 14.

In the EEPROM 54 the amplitude-specifying input signal is employed to address a storage location, whose data contents are read out via line 56 and conducted to a second input of the adder 52. The adder 52 adds its two input signals to produce an algebraic sum at the line 58, which is the composite correction control signal. A distortion for which the data of EEPROM 54 makes corrections is a non-linearity wherein a change of a certain amount in the amplitude selection command at I/O device 2 does not always produce the same amount of change in amplitude of the wave at line 14. The sensitivity is different at different amplitudes; correction of this non-linearity is required.

During normal operation the multiplexer 60 selects input line 58, and passes the composite correction signal through to DAC 64, where it is converted to an analog level signal. That analog level signal, at line 20, controls the gain of the controllable-gain amplifier 22.

Preparations for Calibrating the Amplitude-Control System

In the foregoing embodiment of the invention, calibration consists mainly of storing data to form two look-up tables, one in each of the EEPROMs 48 and 54. The look-up tables consist of appropriate control signal terms that contribute to the signal at line 20 for controlling the gain of the controllable-gain amplifier 22. Various procedures can be used for calibration, of which a preferred one is described here. The two steps involved in preparation are as follows.

First the circuit point at which calibration is desired to be made is selected. It may be at a point of use such as terminal 28, down-circuit from such equipment as the cable 26. A power head of a power sensor 41 is connected at that point for measurement of the signal intensity. That power head is connected through line 12 to the general-purpose interface bus (GPIP) 42, which is a standard Institute of Electrical and Electronics Engineers type 488 instrumentation bus. The GPIP provides orderly access to the CPU 40, so that data regarding the level of the output signal can be entered easily into the computer.

Second, the multiplexer 60 is switched to receive a calibration control signal (which is a "surrogate" control signal), from the CPU 40 on the calibration data line 17, (instead of from the operating data line 58). Multiplexer 60 passes this surrogate control signal to the DAC 64, which outputs an analog equivalent of it to the control line 20 of the controllable-gain amplifier 22. That concludes the preparations for calibration.

Broadly speaking, the calibration procedure itself consists of three main steps, each of which is explained in a separate section (a), (b), or (c) below.

(a) Frequency-Effect Run

First, a frequency-effect run is made across the entire frequency range to ascertain an intermediate level for the amplitude component of control signal and to identify a "test frequency" that produces that intermediate level. The intermediate level is halfway between a maximum and a minimum of the frequency-caused variations in output amplitude.

To perform this run a middle-range amplitude value is selected and maintained constant while the frequency is varied over its entire range. The readings of the power meter 41 fluctuate up and down in a wavelike manner as the test proceeds across the frequency spectrum. A frequency is selected that is at a zero crossing of the wave-like variations of output power. This is identified as a test frequency for use in the calibration of step (b) below.

(b) Calibration to Reduce Amplitude-Dependency of Amplitude

Second, the amplitude-correction memory is loaded, across the entire amplitude range, at a constant frequency. The procedure for loading the amplitude-correction EEPROM 54 is simpler than that for loading the frequency-correction EEPROM 48 because 54 requires only a one-dimensional table, which is addressed only by the specified amplitude. The amplitude-correction apparatus EEPROM 54 provides a main component of control signal for the controllable-gain amplifier 22.

The test frequency, which is the frequency that produces the intermediate level of amplitude in (a) above, is specified at the I/O device 2 and is maintained constant throughout this part of the procedure. A first value of amplitude is specified, and the control signal value necessary to achieve that amplitude is ascertained by means of the power sensor 41. To do this, the computer 40 compares the specified amplitude with the amplitude read by the power sensor 41 and progressively changes the control signal on line 17 in increasing steps. The output signal amplitude at terminal 28 progressively increases toward the specified output amplitude. The most-recently-read reading of the power meter 41 is stored in the CPU 40.

When the amplitude at terminal 28 first exceeds the specified amplitude, the reading is rounded to the setting immediately less than or immediately greater than the specified amplitude, whichever is closer, and the corresponding control signal value is written from the CPU 40 into the appropriate storage address in the EEPROM. (The CPU 40 can write into the EEPROMs and read them for verification.)

Thus, when the output signal reaches a correct amplitude (equaling that which is specified), the closest value of control signal on the line 17 is stored in EEPROM 54 at an address corresponding the specified frequency and the pre-specified amplitude. The appropriate storage address is already standing on the lines 4 and 6 at the address inputs of the EEPROM 54.

The procedure is repeated for many specified amplitudes within the available range of amplitudes.

(c) Calibration to Reduce Frequency-Dependency of Amplitude

Third, the frequency-correction terms are measured over the entire frequency range at a first amplitude, then at a second amplitude, then at a third amplitude, etc., and positive and negative correction terms are loaded into the EEPROM 48. This process is continued until an entire matrix of amplitudes and frequencies is stored in the EEPROM 48.

The frequency correction terms are determined in the CPU by merely measuring the error in amplitude and estimating the amount of control signal correction required to correct the error, in view of a known rate of change. The calibration correction terms can be positive or negative; the adder 52 can handle both signs.

The multiplexer 60 is then switched from input line 17 to input line 58, so that the adder 52 supplies the control signal for the controllable-gain amplifier 22.

If desired the procedure can be automated to step automatically from one specified frequency to a next one through a predetermined range of frequencies, then to change to a different specified amplitude and repeat the frequency steps, and so forth.

Other Embodiments

Numerous other embodiments are possible within the scope of the invention. By way of illustration of the breadth of the invention several of the innumerable practical variations are mentioned briefly below.

For example, in the preferred embodiment that is described above to explain the invention, the memories are preferably EEPROMs, to facilitate calibration. The memories could, however, be EPROMs, PROMs, ROMs, RAMs, etc. For example a standby EPROM could be loaded with the calibration data, then substituted for a current EPROM. The preferred EEPROM memories, on the other hand, can be rewritten in situ by merely sending them a threshold command, erasing the contents, and loading in new data values. Also the EEPROMs are non-volatile, so that calibration is not lost upon interruption of power.

Another possible embodiment of the same invention would be to use a single memory device to replace both of the EEPROMs of the preferred embodiment described above. The adder would then be omitted.

In still another possible embodiment, separate controllable-gain amplifiers such as amplifier 22 could be used in cascade, one for making corrections read from the frequency-related EEPROM and the other for making corrections read from the amplitude-related EEPROM. The adder would then be omitted; the two corrections would be slightly different because their effects would be multiplied instead of added.

As an example of a use that differs from that described above, the corrected-output amplitude at terminal 28 need not be controlled to a constant value. If desired the EEPROM 48 can instead be loaded with calibration data that produces a different amplitude of output for different frequencies, such as ascending amplitude with ascending frequency.

The scope of the invention is determined by the claims.

What is claimed is;

1. An amplitude-control system for a signal generator, said signal generator (10) having provision (30) for receiving input data specifying a desired amplitude and specifying the frequency (4) of an uncorrected signal that the signal generator is to provide at an uncorrected-signal output terminal (14), comprising:
   controllable-gain amplifier means (22) having an input terminal (14) for receiving the uncorrected signal, an output terminal (24) for outputting a corrected signal, and at least one input terminal (20) for receiving a control signal to control the gain of the amplifier;
   first memory means (48) for storing frequency-effect-correction data, said first memory means being directly read to provide immediate output upon being addressed by input data (4, 6) specifying the desired frequency and amplitude of signal;
   second memory means (54) for storing amplitude-effect-correction data, said second memory means being directly read to provide immediate output upon being addressed by input data (6) specifying the desired amplitude of signal;
   means (52, 60, 64) for communicating data (50, 56) read from said first and second memory means to said control-signal terminal (20);
   whereby quick real-time correction of the amplitude of the output signal is accomplished.

2. An amplitude-control system as in claim 1 and wherein said first and second memory means (48, 54) and said means (52, 60, 64) for communicating data (50, 56) comprise means for simultaneous reading and communicating of data from said first and second memory means.

3. An amplitude-control system as in claim 1 and:
   wherein said terminal (20) for receiving a control signal comprises a sole terminal; and
   further comprising means (52) for combining in real time said frequency-effect- and amplitude-effect-correction data (50, 56) to provide immediately a unitary control signal for connection to said sole control-signal terminal (20).

4. An amplitude-control system as in claim 3 and in which said means (52) for combining said frequency-effect- and amplitude-effect-correction data (50, 56) comprises a real-time logic-gate adder means.

5. An amplitude-control system as in claim 1 and wherein said means (52, 60, 64) for communicating data (50, 56) read from said first and second memory means to said control-signal terminal (20) comprises digital-to-analog conversion means (64).

6. An amplitude-control system as in claim 5 and further comprising a calibration subsystem comprising:
   sensing means (41) for measuring the level of corrected output signal at the output (28) of said amplitude-control system;
   means (40) for providing a surrogate control signal for calibration;
   means (17, 60) for switching the surrogate control signal to enable it to communicate (64) with the control-signal terminal (20) of the controllable-gain amplifier means (22);
   means (40) for comparing the corrected output signal (at 28) with the input data (6) specifying a desired amplitude of output signal and for setting the surrogate control signal (at 17) so that the resulting amplitude of corrected output signal (28) substantially equals said input data (6) specifying the desired amplitude, for each of a plurality of specified desired output amplitudes;
   means (40, 16, 54) for storing at an address corresponding to each amplitude in said second memory means (54) the value of said setting of surrogate control signal;

means (40) for comparing the corrected output signal (at 28) with the input data (6) specifying a desired amplitude of output signal and with the control-signal value stored in the second memory means, for determining a frequency-variable correction term of control signal which would result in the specified amplitude (6) of corrected output signal (28), for each of a plurality of frequencies;

means (16) for storing at an address corresponding to each frequency and amplitude in said first memory means (48) the corresponding value of said frequency-variable correction term.

7. An amplitude-control system for a signal generator, said signal generator (10) having provision (30) for receiving input data specifying a desired amplitude and specifying the frequency (4) of an uncorrected signal that the signal generator is to provide at an uncorrected-signal output terminal (14), comprising:

controllable-gain amplifier means (22) having an input terminal (14) for receiving the uncorrected signal, an output terminal (28) for outputting a corrected signal, and at least one input terminal (20) for receiving a control signal to control the gain of the amplifier;

memory means (48) for storing frequency- and amplitude-correction data, said memory means being directly reads upon being addressed by input data (4, 6) specifying the desired frequency and amplitude of signal;

means (60, 64) for communicating data (50, 56) read from said memory means (48) to said control-signal terminal (20).

whereby rapid real-time correction of the amplitude of the output signal is accomplished.

* * * * *

UNITED STATES PATENT AND TRADEMARK OFFICE
CERTIFICATE OF CORRECTION

PATENT NO.   : 5,081,603

DATED        : January 14, 1992

INVENTOR(S)  : J. J. Mikos

It is certified that error appears in the above-identified patent and that said Letters Patent is hereby corrected as shown below:

On the title page: Item [73]: should read:
    Assignee       --Eaton Corporation--

Signed and Sealed this

Tenth Day of August, 1993

Attest:

MICHAEL K. KIRK

*Attesting Officer*    *Acting Commissioner of Patents and Trademarks*